United States Patent [19]
Hirai et al.

[11] Patent Number: 5,840,432
[45] Date of Patent: Nov. 24, 1998

[54] ELECTROCONDUCTIVE PASTE

[75] Inventors: Keizo Hirai, Hitachiota; Hiroshi Wada, Hitachinaka; Akihiro Sasaki, Hitachi; Hisashi Kaga, Hakodate; Junichi Kikuchi; Shozo Yamana, both of Hitachi; Hideji Kuwajima, Hitachinaka, all of Japan

[73] Assignees: Hitachi Chemical Company, Ltd., Tokyo; Technopolis Hakodate Industrial Technology, Hokkaido, both of Japan

[21] Appl. No.: 598,701

[22] Filed: Feb. 8, 1996

[30] Foreign Application Priority Data

| | | | |
|---|---|---|---|
| Feb. 13, 1995 | [JP] | Japan | 7-023259 |
| Feb. 13, 1995 | [JP] | Japan | 7-023260 |
| Feb. 13, 1995 | [JP] | Japan | 7-023261 |
| Jun. 23, 1995 | [JP] | Japan | 7-157255 |

[51] Int. Cl.$^6$ .................................................. B22F 3/00
[52] U.S. Cl. ................... 428/570; 428/546; 428/548; 428/615; 428/647; 428/669; 252/514
[58] Field of Search ..................... 428/546, 548, 428/570, 615, 647, 669; 252/514, 512

[56] References Cited

U.S. PATENT DOCUMENTS

| | | | |
|---|---|---|---|
| 2,418,460 | 4/1947 | Buehler | 428/669 |
| 3,202,488 | 8/1965 | Ehrreich et al. | 428/570 |
| 3,401,024 | 9/1968 | Holt et al. | 428/570 |
| 4,001,146 | 1/1977 | Horowitz | 428/434 |
| 4,246,322 | 1/1981 | Wall et al. | 428/669 |
| 4,541,876 | 9/1985 | Hwang | 148/22 |
| 4,652,465 | 3/1987 | Koto et al. | 252/514 |
| 4,711,814 | 12/1987 | Teichmann | 252/514 |
| 4,745,035 | 5/1988 | Saurer et al. | 428/669 |
| 4,857,233 | 8/1989 | Teichmann et al. | 252/514 |
| 4,959,273 | 9/1990 | Hamamura et al. | 428/548 |
| 5,372,749 | 12/1994 | Li et al. | 252/512 |

FOREIGN PATENT DOCUMENTS

| | | |
|---|---|---|
| 568892 | 1/1981 | Japan . |
| 3247702 | 11/1991 | Japan . |
| 4268381 | 9/1992 | Japan . |

*Primary Examiner*—Cathy F. Lam
*Attorney, Agent, or Firm*—Antonelli, Terry, Stout & Kraus, LLP

[57] ABSTRACT

Electroconductive composite metal powders comprising flat non-noble metal powders, each covered with a noble metal in an amount of 2 to 30% by weight in average based on the weight of the non-noble metal powders, on 50% or more in average of the whole surface area of the non-noble metal powders, interposing a layer of a mixture of the non-noble metal and noble metal between each non-noble metal powder and a noble metal covering layer, are suitable for providing an electroconductive paste after mixing with a binder, said paste showing excellent electroconductivity and prevention of migration.

37 Claims, 1 Drawing Sheet

ELECTROCONDUCTIVE PASTE

BACKGROUND OF THE INVENTION

This invention relates to electroconductive composite metal powders, processes for producing the same, an electroconductive paste obtained by using the electroconductive composite metal powders, processes for producing the same, electric circuit devices obtained by using the electroconductive paste, and process for producing the same.

As a process for forming circuit conductors on wiring boards, or on insulating substrates for mounting electronic parts, it has been known to use an electroconductive paste prepared by mixing an electroconductive metal powder (e.g. gold, silver, palladium, copper, aluminum powders) with a binder such as a resin or glass frit and a solvent for forming circuit conductors by coating or printing. The electroconductive paste is applied to through-hole connection, electrode formation, jumper wires, electromagnetic shielding, and the like.

On the other hand, as a process for mounting electronic parts such as resistor elements, chip resistors, chip condensers on circuit conductors, it is known a process comprising coating or printing a solder paste comprising solder particles and a binder, heat treating at a temperature higher than the melting of solder to give an electronic circuit device.

Among various electroconductive metal powders, since gold is remarkably expensive, silver is used as an electroconductive metal powder in a field requiring high electroconductivity and copper is used in other fields. But silver is expensive next to gold and palladium. Further, when a direct current voltage is applied to silver in the presence of water, electrodeposition of silver called "migration" takes place on electrodes and circuit conductors to cause short circuit between electrodes or between wirings. This is a serious problem.

In order to prevent the migration of silver, an electroconductive material containing an alloy of silver and palladium as an electroconductive metal powder is available commercially. But such a material is also very expensive.

On the other hand, copper is cheap and relatively hardly cause the migration. But there is a problem in that when an electroconductive paste is heated, an oxidized film is formed on surfaces of copper particles due to oxygen in the air and the binder to worsen the electroconductivity. Therefore, conductor surfaces are coated with a moisture-resistant paint, or an anticorrosive agent and/or antioxidant are added to the electroconductive material. But sufficient effects are not obtained.

JP-A 56-8892 discloses a process for using silver-plated copper powder in order to improve resistance to oxidation of copper and resistance to migration of silver. But, according to this process, electroconductivity is worsened compared with the case of using silver powders and a part of silver powders is only replaced by copper powders.

JP-A 3-247702 and JP-A 4-268381 propose processes for preparing electroconductive particles by atomizing silver particles on surfaces of copper powders. But these processes are complicated to raise production cost. Further, the resulting powders have a problem in that the resulting powders are almost spherical to give a smaller contact area between powders compared with flat or branched powders and to give a high resistance.

As to the solder pastes, lower heat treating temperature and without use of lead are required seriously recently, but no lead-free solder having sufficiency in melting point and workability has been obtained.

SUMMARY OF THE INVENTION

It is an object of the present invention to provide electroconductive composite metal powders excellent in electroconductivity and prevention of migration and suitable for preparing an electroconductive paste, and a process for producing the same with a low cost.

It is another object of the present invention to provide an electroconductive paste excellent in electroconductivity and prevention of migration, and a process for producing the same.

It is a further object of the present invention to provide an electric circuit device capable of mounting electronic parts without using a lead-free solder, and a process for producing the same.

This invention provides an electroconductive composite metal powder comprising a flat non-noble metal powder, 50% or more of surface area of which is covered with a noble metal in an amount of 2 to 30% by weight based on the weight of the non-noble metal powder, interposing a layer of a mixture of the non-noble metal and noble metal between the non-noble metal powder and a noble metal covering layer.

This invention also provide a process for producing electroconductive composite metal powders, which comprises covering each surface of each non-noble metal powder with 2 to 30% by weight of a noble metal based on the weight of the non-noble metal powder, adding mechanical energy to the covered powders to deform the covered powders into a flat shape and to form a layer of a mixture of the non-noble metal and noble metal between a noble metal covering layer and the non-noble metal powder.

This invention further provides a process for producing electroconductive composite metal powders, which comprises adding mechanical energy to a mixture of non-noble metal powders and noble metal powders to deform the mixture into a flat shape, while covering each surface of each non-noble metal powder with the noble metal in an amount of 2 to 30% by weight based on the weight of the non-noble metal powder and forming a layer of a mixture of the non-noble metal and noble metal between a noble metal covering layer and the non-noble metal powder.

This invention still further provides an electroconductive paste comprising electroconductive composite metal powders, each powder comprising a flat non-noble metal powder, 50% or more of surface area of which is covered with a noble metal in an amount of 2 to 30% by weight based on the weight of the non-noble metal powder, interposing a layer of a mixture of the non-noble metal and noble metal between the non-noble metal powder and a noble metal covering layer, and a binder.

This invention also provides a process for producing an electroconductive paste, which comprises covering each surface of each non-noble metal powder with 2 to 30% by weight of a noble metal based on the weight of the non-noble metal powder, adding mechanical energy to the covered powders to deform the covered powders into a flat shape and to form a layer of a mixture of the non-noble metal and noble metal between a noble metal covering layer and the non-noble metal powder, and adding a binder to the thus treated powders, followed by mixing to give a uniform paste.

This invention further provides a process for producing an electroconductive paste, which comprises adding mechanical energy to a mixture of non-noble metal powders and noble metal powders to deform the mixture into a flat shape, while covering each surface of each non-noble metal powder with the noble metal in an amount of 2 to 30% by weight based on the weight of the non-noble metal powder and forming a layer of a mixture of the non-noble metal and noble metal between a noble metal covering layer and the non-noble metal powder, and adding a binder to the thus treated powders, followed by mixing to give a uniform paste.

This invention also provides an electric circuit device comprising an insulating substrate, circuit conductors formed on the insulating substrate using the electroconductive paste mentioned above, and electronic parts mounted on the circuit conductors.

This invention further provides a process for producing an electric circuit device, which comprises coating an electroconductive paste mentioned above on an insulating substrate by printing or potting to form circuit conductors, and mounting electronic parts on the circuit conductors.

DESCRIPTION OF THE PREFERRED EMBODIMENTS

Figure 1:
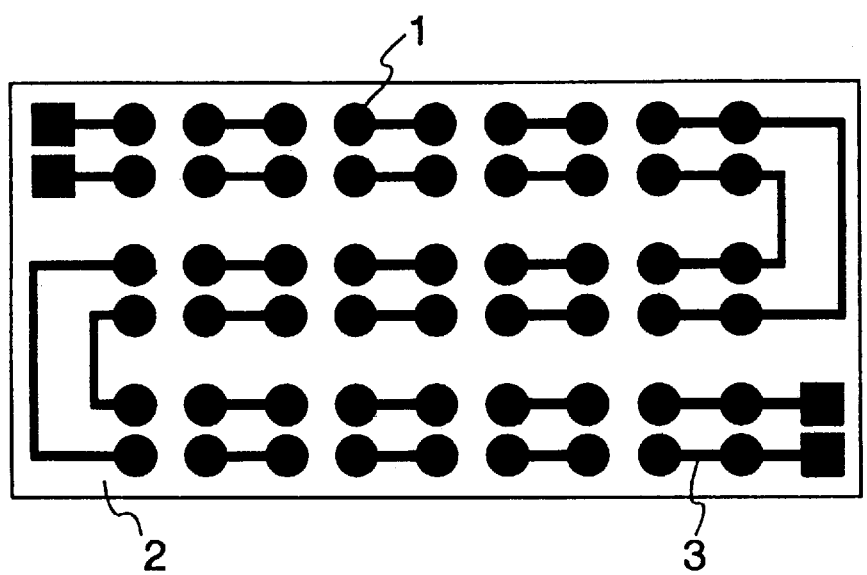
FIG. 1 is a plan view of a paper base phenolic resin copper-clad laminate on which an electroconductive paste is printed and through-holes are also filled.

The electroconductive composite metal powder of the present invention comprises a flat non-noble metal powder covered with a noble metal in an amount of 2 to 30% by weight based on the weight of the non-noble metal powder on 50% or more of the whole surface area of the non-noble metal powder, interposing a layer of a mixture of the non-noble metal and noble metal between the non-noble metal powder and a noble metal covering layer.

In the present invention, the word "flat" or "a flat shape" means a shape obtained by pressing a three dimensional shape such as a sphere or block in one direction. The term "flat shape" includes a so-called flake shape.

The non-noble metal means a non-expensive metal having good electroconductivity. Examples of the non-noble metal are copper, copper alloys, nickel, nickel alloys, zinc, zinc alloys, tin, tin alloys, chronium, chromium alloys, etc.

The noble metal, which is used for covering non-noble metal powders, includes gold, silver, palladium, platinum, etc. from the viewpoint of resistance to oxidation and high electroconductivity.

Covering of non-noble metal powders with a noble metal can be carried out, for example, by a plating method, a vapor deposition method, a mechanofusion method wherein covering is carried out using mechanical energy. It is also possible to cover surfaces of non-noble metal powders with a noble metal by mixing fine noble metal powders, for example, having a diameter of 2 $\mu$m or less with non-noble metal powders having relatively larger particle size, for example, 5 $\mu$m or more using a ball mill, a mechanical alloying apparatus, etc.

The surface area of flat non-noble metal powders covered with a noble metal (hereinafter referred to as "covered area") is 50% or more based on the whole surface area of each flat non-noble metal powder.

The amount of noble metal for covering (hereinafter referred to as "covering amount") is 2 to 30% by weight based on the weight of each flat non-noble metal powder.

When the covered area is less than 50% or the covering amount is less than 2% by weight, electroconductivity is worsened when coated on a substrate as an electroconductive paste and heat treated because of oxidation of underlying flat non-noble metal powders. On the other hand, when the covering amount is more than 30% by weight, prevention of migration becomes poor.

The covered area can be determined by taking out 5 particles from electroconductive composite metal powders at random, subjecting to quantitative analysis of the noble metal and non-noble metal using an Auger spectroanalyzer, calculating the proportion of the noble metal, and obtaining an average value of the noble metal, which is the covered area.

The proportions of the non-noble metal and noble metal can be measured by taking out 1 g of electroconductive composite metal powders, dissolving in nitric acid, and subjecting the resulting dissolved solution to chemical quantitative analysis using, for example, an atomic absorption spectrochemical analyzer.

The covered area is 50% or more, but in order to form a local battery on the non-noble metal powder so as to suppress dissolution of noble metal, it is preferable to make a part of the non-noble metal powder not covered with the noble metal. The covering amount of noble metal is preferably 7 to 25% by weight, more preferably 15 to 20% by weight.

In the present invention, a layer of a mixture of the non-noble metal used as a base and noble metal used for covering should be interposed between the flat non-noble metal powder and a noble metal covering layer. The thickness of the layer of a mixture of the non-noble metal and noble metal is ½ to ⅟₅₀ of that of the noble metal covering layer in order to provide excellent electroconductivity and prevention of migration. When the thickness is more than ½ or less than ⅟₅₀ of that of the noble metal covering layer, there is a tendency to worsen the electroconductivity remarkably. The thickness of the layer of a mixture of the non-noble metal and noble metal is preferably ½ to ⅟₄₀, more preferably ½ to ⅟₃₀ of that of the noble metal covering layer.

The thickness of the layer of a mixture of the non-noble metal and noble metal can be determined by taking out 5 particles of the electroconductive composite metal powders at random, scraping the surface by ion sputtering and at the same time subjecting to elementary quantitative analysis using an Auger spectroanalyzer at 3 points or more per particle, calculating an average value for individual thicknesses and determining the thickness for the average value.

The layer of a mixture of the non-noble metal and noble metal preferably contains the noble metal in an amount of 80 to 20 atomic % and the non-noble metal in an amount of 20 to 80 atomic % in order to provide excellent electroconductivity and prevention of migration.

The thickness of the noble metal covering layer is preferably 0.01 to 0.2 $\mu$m, considering that the electroconductive composite metal powders are made into a paste and screen printed on a substrate, and in order to show excellent electroconductivity and prevention of migration. When the thickness is less than 0.01 μm, there is a tendency to worse the electroconductivity. On the other hand, when the thickness is more than 0.2 μm, there is a tendency to worsen the prevention of migration.

In the electroconductive composite metal powders, it is preferable that the non-noble metal powder has a ratio of major axis (or longer diameter) to thickness (i.e. major axis/thickness) of 2 to 30 in order to give excellent electroconductivity and resistance to oxidation, more preferably 5 to 20, particularly preferably 7 to 15. When the ratio of major axis/thickness is less than 2, there is a tendency to cause high resistance due to almost point contact between powders. On the other hand, when the ratio of major axis/thickness is more than 30, it becomes difficult to cover 50% or more of the whole surface area of the flat non-noble metal powder with the noble metal even if the amount thereof is 30% by weight. When such a powder is used in an electroconductive paste, which is coated on a substrate and subjected to heat treatment, the underlying non-noble metal powders are oxidized to worsen electroconductivity.

The major axis preferably is 100 μm or less in an absolute value, more preferably 50 μm or less, particularly preferably 30 μm or less. The ratio of major axis/thickness of electroconductive composite metal powders can be obtained by taking a SEM picture of electroconductive composite metal powders using a scanning electron microscope (SEM), selecting 30 or more particles at random from the picture, measuring their ratios of major axis/thickness and obtaining the average value.

The electroconductive composite metal powders can be produced by (i) covering surfaces of non-noble metal powders with 2 to 30% by weight of a noble metal based on the weight of the non-noble metal powders, adding mechanical energy to the covered powders to deform the covered powders into a flat shape and to form a layer of a mixture of the non-noble metal and noble metal between a noble metal covering layer and the non-noble metal powder, or (ii) adding mechanical energy to a mixture of non-noble metal powders and noble metal powders to deform the mixture into a flat shape, while covering surfaces of the non-noble metal powders with the noble metal in an amount of 2 to 30% by weight based on the weight of the non-noble metal powders and forming a layer of a mixture of the non-noble metal and noble metal between a noble metal covering layer and the non-noble metal powders.

More in detail, copper powders having an average diameter of 1 to 30 μm measured by a generally used method such as a laser method, or a precipitation method for measuring particle size distribution, are covered with silver by plating or vapor deposition.

After covering the non-noble metal powders with a noble metal, mechanical energy is added to the covered powders using a compressing apparatus such as a mechanical alloying apparatus, a dry ball milling apparatus, a roll, or an apparatus wherein a hard substance is sprayed with a powder at high speed. Alternatively, a mixture of non-noble metal powders and noble metal powders is subjected to application of mechanical energy to give the desired electroconductive composite metal powders.

By applying mechanical energy to the non-noble metal powders covered with a noble metal, or by applying mechanical energy to a mixture of non-noble metal powders and noble metal powders, voids present in the noble metal or present between the noble metal covering layer and the base non-noble metal powder are removed to make the noble metal covering layer densified and to enhance electroconductivity. Further, at this time, a layer of a mixture of the noble metal and the non-noble metal is formed between the noble metal covering layer and the base non-noble metal powder, so that the contact resistance between the noble metal covering layer and the non-noble metal powder can be reduced.

The electroconductive paste of the present invention comprises:

electroconductive composite metal powders, each powder comprising a flat non-noble metal powder covered with a noble metal in an amount of 2 to 30% by weight based on the weight of the non-noble metal powder on 50% or more of the whole surface area of the non-noble metal powder, interposing a layer of a mixture of the non-noble metal and noble metal between the non-noble metal powder and a noble metal covering layer, and a binder.

As the binder, there can be used an organic binder such as an epoxy resin, a phenol resin, an unsaturated polyester resin, a saturated polyester resin, a polyamide resin, a polyimide resin, a polyamide-imide resin, an acrylic resin, etc. or an inorganic binder such as glass frit, etc.

The electroconductive paste may further contain, if necessary, one or more curing accelerators conventionally used such as imidazoles, amines, etc., an organic solvent such as butyl Cellosolve, terpineol, ethylene carbitol, carbitol acetate, etc.

The paste in a uniform mixture can be obtained by using a mixing and grinding machine, a roll, a kneader, etc.

The binder can be used preferably in an amount of 5 to 30% by weight, more preferably 8 to 16% by weight, based on the weight of the electroconductive paste.

The curing accelerator can be used, if used, in an amount of preferably 0.01 to 1% by weight, more preferably 0.02 to 0.05% by weight, based on the weight of the electroconductive paste.

The solvent can be use, if used, in an amount of preferably 3 to 50% by weight, more preferably 10 to 30% by weight, based on the weight of the electroconductive paste.

The electroconductive paste can be produced by (i) covering each surface of each non-noble metal powder with 2 to 30% by weight of a noble metal based on the weight of the non-noble metal powder, adding mechanical energy to the covered powders to deform the covered powders into a flat shape and to form a layer of a mixture of the non-noble metal and noble metal between a noble metal covering layer and the non-noble metal powder, and adding a binder to the thus treated powders, followed by mixing to give a uniform paste, or (ii) adding mechanical energy to a mixture of non-noble metal powders and noble metal powders to deform the mixture into a flat shape, while covering each surface of each non-noble metal powder with the noble metal in an amount of 2 to 30% by weight based on the weight of the non-noble metal powders and forming a layer of a mixture of the non-noble metal and noble metal between a noble metal covering layer and the non-noble metal powder, and adding a binder to the thus treated powders, followed by mixing to give a uniform paste.

The electroconductive paste can be used for providing an electric circuit device comprising an insulating substrate, circuit conductors formed on the insulating substrate using the electroconductive paste, and electronic parts mounted on the circuit conductors.

As the insulating substrate, there can be used various substrates and various films. Examples of the substrates are a paper base phenol resin substrate, glass base epoxy resin substrate, an enameled substrate, a ceramic substrate, etc. Examples of the films are films of flexible resins such as polyethylene, polycarbonate, polyvinyl chloride, polystyrene, polyethylene terephthalate, polyphenylene sulfide, polyether ketone, polyetherimide, polyimide, etc.

As the electronic parts, there can be used, resistance elements, chip resistors, chip condensers, etc.

The electric circuit device can be produced, for example, by coating the electroconductive paste on an insulating substrate by printing or potting to form circuit conductors, and mounting electronic parts on the circuit conductors.

In the present invention, it is possible to use an insulating substrate having a part of conductors or resistors previously formed by plating, printing, vapor deposition, etching, and the like on the surface of the insulating substrate or in through-holes.

The electroconductive paste of the present invention can be used not only for forming circuit conductors but also for through-hole connection, formation of electrodes, jumper wires, electromagnetic shields, etc. Further, the electroconductive paste can be used as an electroconductive adhesive for connecting the electronic parts and the insulating substrate, as a substitute for lead-free solder.

The present invention is illustrated by way of the following Examples, in which all parts and percents are by weight unless otherwise specified.

Example 1

Spheric copper powders having an average particle size of 5 $\mu$m (SF-Cu, a trade name, mfd. by Nippon Atomized Metal Powders Corp.) was degreased with an acidic cleaner (L-5B, a trade name, mfd. by Japan MacDermid Co., Ltd.) followed by washing with water. The resulting copper powders were placed in a plating bath containing 20 g of AgCN and 10 g of NaCN per liter of water to conduct electroless plating so as to make the amount of silver 20% based on the weight of the spherical copper powders. After washing with water and drying, silver-plated copper powders were obtained.

The silver-plated copper powders were charged in a mechanical alloying (MA) apparatus and subjected to deformation treatment. This apparatus employs a method of moving balls by rotating a screw. The effective volume of the container of the apparatus for charging the balls and the powders to be treated was 1.1 liters. Into this apparatus, 4 kg of zirconia balls (diameter 10 mm) and 200 g of the silver-plated copper powders were charged. The screw was revolved at 90 r.p.m. under an inner pressure of $2\times10^{-5}$ Torr for 2 hours to give the desired electroconductive composite metal powders (flat silver-plated copper powders).

Then, an SEM photograph of the resulting electroconductive composite metal powders was taken using a scanning electron microscope. 30 Particles of the electroconductive composite metal powders were selected at random to measure the ratio of major axis/thickness. The ratio was 2 to 15, and 6 in average. The major axis was in the range of 2 to 30 $\mu$m, and 15 $\mu$m in average.

5 Particles of electroconductive composite metal powders were taken out at random to measure the covered area with silver using an scanning Auger electron spectroanalyzer by quantitative analysis of the noble metal and the non-noble metal. The covered area was in the range of 45 to 85%, and 70% in average based on the whole surface area.

Further, 5 particles of electroconductive composite metal powders were taken out at random and subjected to scraping of surfaces by ion sputtering and at the same time measurement at 3 points or more per particle using an scanning Auger electron spectroanalyzer.

The thickness of silver covering layer was in the range of 0.02 to 0.15 $\mu$m, and 0.045 $\mu$m in average. The thickness of the layer of a mixture of noble metal (silver 80 to 20 atomic %) and non-noble metal (copper) was in the range of 0.001 to 0.05 $\mu$m, and 0.01 $\mu$m in average, and in the range of $\frac{1}{20}$ to $\frac{1}{2}$, and $\frac{1}{4.5}$ in average of the thickness of the silver covering layer.

In the following Examples and Comparative Examples, the measurements were carried out in the same manner as mentioned above.

An electroconductive paste was prepared by mixing uniformly 100 parts of the electroconductive composite metal powders, 15 parts of novolac phenol resin (PS-2607, a trade name, mfd. by Gunei Chemical Industry Co., Ltd.) and 15 parts of butyl Cellosolve as a solvent.

On a paper base phenol resin copper-clad laminate (MCL-437F, a trade name, mfd. by Hitachi Chemical Co., Ltd.) having a thickness of 1.6 mm and removing a copper foil, the electroconductive paste was printed via a screen of 200 mesh to give a test pattern of 0.4 mm wide and 100 mm long, followed by heating at 150° C. for 30 minutes in the air to give circuit conductors.

The resistivity of the circuit conductors of cured electroconductive paste was 75 $\mu\Omega$·cm in average, which value shows good electroconductivity corresponding to the silver paste mentioned below.

On the other hand, the electroconductive paste was coated on a glass plate by printing as mentioned above to give electrodes of 2 mm wide with an interval of 2 mm, followed by heating at 150° C. for 30 minutes in the air for curing.

Then, prevention of migration was evaluated by placing a filter paper of 2 mm wide between the electrodes, dropping 0.5 ml of deionized water on the filter, applying a direct current of 20 V to the electrodes, and measuring a leakage current between the electrodes with the lapse of time. As a result, a time required for passing 200 $\mu$A of leakage current was 80 minutes in average. This means that prevention of migration was excellent.

The measurement of resistivity and evaluation of prevention of migration were carried out using 5 samples to obtain an average value. This is the same in the following Examples and Comparative Examples.

Comparative Example 1

An electroconductive paste was prepared in the same manner as described in Example 1 except for omitting deformation of spherical silver-plated copper powder into a flat shape. The ratio of major axis/thickness of spherical silver-plated copper powders was 1. The covered area with silver was 95% or more based on the whole surface area. The thickness of silver covering layer was in the range of 0.1 to 0.15 $\mu$m, and 0.12 $\mu$m in average. But it was impossible to admit a layer of a mixture of the noble metal (silver in 80 to 20 atomic %) and non-noble metal (copper).

The resistivity of the cured electroconductive paste was as remarkably high as 1200 $\mu\Omega$·cm in average, and the time required for passing 200 μA of leakage current was as short as 10 minutes in average. This means that prevention of migration was poor.

Comparative Example 2

Spherical copper powders having an average particle size of 5 μm (SF-Cu, a trade name, mfd. by Nippon Atomized Metal Powders Corp.) was deformed in the same manner as described in Example 1 so as to make the ratio of major axis/thickness 6, followed by covering of silver in an amount of 20% in the same plating method as used in Example 1. The covered area with silver was 85% or more based on the whole surface area of copper powder. The thickness of silver covering layer was in the range of 0.03 to 0.2 μm, and 0.08 μm in average. But it was impossible to admit a layer of a mixture of noble metal (silver 80 to 20 atomic %) and non-noble metal (copper).

An electroconductive paste was prepared in the same manner as described in Example 1.

The resistivity of the cured electroconductive paste was as high as 800 μΩ•cm, and the time required for passing 200 μA of leakage current was as short as 10 minutes. This means that prevention of migration was poor.

Comparative Example 3

An electroconductive paste was prepared in the same manner as described in Example 1 except for using silver powders having the ratio of major axis/thickness of 6 (TCG-1, a trade name, mfd. by Tokuriki Chemical Research Laboratory, Ltd.) in place of the electroconductive composite metal powders used in Example 1.

The resistivity of the cured electroconductive paste was 80 μΩ•cm in average, but the time required for passing 200 μA of leakage current was as remarkably short as 30 seconds in average. This means that prevention of migration was poor.

Comparative Example 4

A copper paste for electromagnetic (EMI) shield available commercially was evaluated in the same manner as described in Example 1.

The resistivity of cured electroconductive paste was as high as 500 μΩ•cm in average, and the time required for passing 200 μA of leakage current was 45 minutes in average.

Example 2

Spherical copper powders having an average particle size of 6 μm (SF-Cu, a trade name, mfd. by Nippon Atomized Metal Powders Corp.) was covered with silver in an amount of 30% by the same plating method as used in Example 1 to give silver-plated copper powders. Electroconductive composite metal powders were obtained in the same manner as described in Example 1 except for changing the treating time in the MA apparatus to 1 hour.

The major axis of particles of the resulting electroconductive composite metal powders was in the range of 3 to 15 μm, and 7 μm in average. The ratio of major axis/thickness was in the range of 2 to 9, and 2.5 in average. The covered area with silver is in the range 75 to 100% based on the whole surface area, and 95% in average. The thickness of the silver covering layer was in the range of 0.05 to 0.2 μm, and 0.1 μm in average. The thickness of the layer of a mixture of noble metal (silver 80 to 20 atomic %) and non-noble metal (copper) was in the range of 0.001 to 0.01 μm, and 0.006 μm in average. The thickness of the layer of a mixture of noble metal and non-noble metal was in the range of 1/50 to 1/8, and 1/16.7 in average, of that of the silver covering layer.

An electroconductive paste was prepared and evaluated in the same manner as described in Example 1.

The resistivity of the cured electroconductive paste was 80 μΩ•cm in average and the time required for passing 200 μA of leakage current was 40 minutes in average.

Example 3

Electroconductive composite metal powders were prepared in the same manner as described in Example 1 except for covering spherical copper powders having an average particle size of 6 μm (SF-Cu, a trade name, mfd. by Nippon Atomized Metal Powders Corp.) with silver in an amount of 10%.

The major axis of particles of the resulting electroconductive composite metal powders was in the range of 2 to 30 μm, and 15 μm in average. The ratio of major axis/thickness was in the range of 2 to 15, and 6 in average. The covered area with silver was in the range of 30 to 70% of the whole surface area, and 51% in average. The thickness of silver covering layer was in the range of 0.01 to 0.03 μm, and 0.02 μm in average. The thickness of the layer of a mixture of noble metal (silver 80 to 20 atomic %) and non-noble metal (copper) was in the range of 0.001 to 0.02 μm, and 0.01 μm in average, and in the range of 1/10 to 2/3, and 1/2 in average of the thickness of the silver covering layer.

An electroconductive paste was prepared and evaluated in the same manner as described in Example 1.

The resistivity of the cured electroconductive paste was 135 μΩ•cm in average, and the time required for passing 200 μA of leakage current was 60 minutes in average.

Example 4

Electroconductive composite metal powders were prepared in the same manner as described in Example 1 except for giving silver-plated copper powders by covering spherical copper powders having an average particle size of 6 μm (SF-Cu, a trade name, mfd. by Nippon Atomized Metal Powders Corp.) with silver in an amount of 2% and treatment in the MA apparatus for 1 hour.

The major axis of particles of the resulting electroconductive composite metal powders was in the range of 2 to 20 μm, and 9 μm in average. The ratio of major axis/thickness was in the range of 2 to 13, and 4 in average. The covered area with silver was in the range of 15 to 70% of the whole surface area, and 55% in average, based on the whole surface area. The thickness of the silver covering layer was in the range of 0.0001 to 0.02 μm, and 0.01 μm in average. The thickness of the layer of a mixture of noble metal (silver 80 to 20 atomic %) and non-noble metal (copper) was in the range of 0.0001 to 0.003 μm, and 0.002 μm in average, and in the range of 1/15 to 1/4, and 1/5 in average of the thickness of the silver covering layer.

An electroconductive paste was prepared and evaluated in the same manner as described in Example 1.

The resistivity of cured electroconductive paste was 110 μΩ•cm in average and the time required for passing 200 μA of leakage current was 100 minutes in average.

Comparative Example 5

Electroconductive composite metal powders were prepared in the same manner as described in Example 1 except for covering spherical copper powders having an average particle size of 6 μm (SF-Cu, a trade name, mfd. by Nippon Atomized Metal Powders Corp.) with silver in an amount of 1.5%.

The major axis of particles of the resulting electroconductive composite metal powders was in the range of 2 to 30 μm, and 15 μm in average. The ratio of major axis/thickness was in the range of 4 to 18, and 6 in average. The covered area with silver was in the range of 5 to 35% of the whole surface area, and 20% in average. The thickness of the silver covering layer was in the range of 0.00005 to 0.005 μm, and 0.003 μm in average. The thickness of the layer of a mixture of noble metal (silver 80 to 20 atomic %) and non-noble metal (copper) was in the range of 0.00005 to 0.005 μm, and 0.003 μm in average, and in the range of ½ to ½, and ⅖ in average of the thickness of the silver covering layer.

An electroconductive paste was prepared and evaluated in the same manner as described in Example 1.

The resistivity of cured electroconductive paste was as high as 450 μΩ•cm, and the time required for passing 200 μA of leakage current was 90 minutes in average.

Comparative Example 6

Electroconductive composite metal powders were prepared in the same manner as described in Example 1 except for covering spherical copper powders having an average particle size of 6 μm (SF-Cu, a trade name, mfd. by Nippon Atomized Powders Corp.) with silver in an amount of 35%.

The major axis of particles of the resulting electroconductive composite metal powders was in the range of 2 to 25 μm, and 10 μm in average. The ratio of major axis/thickness was in the range of 3 to 20, and 5 in average. The covered area with silver was in the range of 65 to 95% of the whole surface area, and 80% in average. The thickness of the silver covering layer was in the range of 0.03 to 0.2 μm, and 0.06 μm in average. The thickness of the layer of a mixture of noble metal (silver 80 to 20 atomic %) and non-noble metal (copper) was in the range of 0.0001 to 0.003 μm, and 0.001 μm in average, and in the range of ⅟₅₀₀ to ⅟₅₀, and ⅟₆₀ in average of the thickness of the silver covering layer.

An electroconductive paste was prepared and evaluated in the same manner as described in Example 1.

The resistivity of cured electroconductive paste was 130 μΩ•cm in average, and the time required for passing 200 μA of leakage current was as short as 10 minutes in average. This means that prevention of migration was poor.

Example 5

Electroconductive composite metal powders were prepared by pressing the silver plated copper obtained in Example 2 (covering amount of silver being 30%) using a two-roll mill.

The major axis of particles of the electroconductive composite metal powders was in the range of 5 to 55 μm, and 30 μm in average. The ratio of major axis/thickness was in the range of 15 to 50, and 27 in average. The covered area with silver was in the range of 35 to 80% of the whole surface area, and 80% in average. The thickness of the silver covering layer was in the range of 0.002 to 0.02 μm, and 0.0125 μm in average. The thickness of the layer of a mixture of noble metal (silver 80 to 20 atomic %) and non-noble metal (copper) was in the range of 0.0001 to 0.0005 μm, and 0.00025 in average, and in the range of ⅟₂₀ to ⅟₁₀₀, and ⅟₅₀ in average of the thickness of the silver covering layer.

An electroconductive paste was prepared and evaluated in the same manner as described in Example 1.

The resistivity of cured electroconductive paste was 115 μΩ•cm in average, and the time required for passing 200 μA of leakage current was 50 minutes in average.

Example 6

Spherical copper powders having an average particle size of 5 μm (SF-Cu, a trade name, mfd. by Nippon Atomized Metal Powders Corp.) were held in a dish-like container in a vapor deposition apparatus and subjected to vapor deposition of silver so as to give silver-vapor deposited copper powders covered with silver in an amount of 20% based on the weight of copper powders, while revolving the dish-like container.

Electroconductive composite metal powders were obtained in the same manner as described in Example 1.

The major axis of particles of the resulting electroconductive composite metal powders was in the range of 3 to 15 μm, and 7 μm in average. The ratio of major axis/thickness was in the range of 2 to 15, and 6 in average. The covered area with silver was in the range of 75 to 100% of the whole surface area, and 90% in average. The thickness of the silver covering layer was in the range of 0.02 to 0.18 μm, and 0.04 μm in average. The thickness of the layer of a mixture of noble metal (silver 80 to 20 atomic %) and non-noble metal (copper) was in the range of 0.001 to 0.05 μm, and 0.015 μm in average, and in the range of ⅟₂₀ to ⅕, and ⅟₂.₇ in average of the thickness of the silver covering layer.

An electroconductive paste was prepared and evaluated in the same manner as described in Example 1.

The resistivity of cured electroconductive paste was 55 μΩ•-cm in average, and the time required for passing 200 μA of leakage current was 90 minutes in average.

Example 7

A solventless mixed resin was obtained by mixing 100 parts of bisphenol A liquid epoxy resin (Epikote 828, a trade name, mfd. by Yuka Shell Co., Ltd.) and 55.8 parts of novolac phenol-formaldehyde resin (HP-607N, a trade name, mfd. by Hitachi Chemical Co., Ltd.) and heating at 110° C.

Then, 8 parts of the resulting solventless mixed resin and 0.04 part of benzyldimethylamine as a curing accelerator were added to 100 parts of the electroconductive composite metal powders obtained in Example 1 and mixed uniformly to give an electroconductive paste. The properties were evaluated in the same manner as described in Example 1.

The resistivity of cured electroconductive paste was 85 μΩ•cm in average, and the time required for passing 200 μA of leakage current was 80 minutes in average.

Example 8

Electroconductive composite metal powders were obtained by placing 80 parts (160 g) of spherical copper powder having an average particle size of 6 μm (SF-Cu, a trade name, mfd. by Nippon Atomized Metal Powders Corp.) and 20 parts (40 g) of very fine spherical silver powders having an average particle size of 1 μm (mfd. by Nippon Atomized Metal Powders Corp.) in an MA apparatus, and subjecting to the same treatment as in Example 1.

The major axis of particles of the resulting electroconductive composite metal powders was in the range of 2 to 30 μm, and 15 μm in average. The ratio of major axis/thickness was in the range of 2 to 15, and 6 in average. The covered area with silver was in the range of 40 to 65% of the whole surface area, and 55% in average. The thickness of the silver covering layer was in the range of 0.005 to 0.1 μm, and 0.03 μm in average. The thickness of the layer of a mixture of noble metal (silver 80 to 20 atomic %) and non-noble metal (copper) was in the range of 0.003 to 0.05 μm, and 0.01 μm in average, and in the range of ⅟₁₀ to ½, and ⅓ in average of the thickness of the silver covering layer.

An electroconductive paste was prepared and evaluated in the same manner as described in Example 1.

The resistivity of cured electroconductive paste was 140 $\mu\Omega\cdot$cm in average, and the time required for passing 200 $\mu$A of leakage current was 40 minutes in average.

Example 9

A resin composition was prepared by previously dissolving 60 parts of bisphenol A epoxy resin (Epinal 834, a trade name, mfd. by Yuka Shell Epoxy Co., Ltd.) and 40 parts of bisphenol A epoxy resin (Epinal 828, a trade name, mfd. by Yuka Shell Epoxy Co., Ltd.) with heating, cooling to room temperature (20° C.), and adding 5 parts of 2-ethyl-4-methylimidazole, 20 parts of ethyl carbitol and 20 parts of butyl Cellosolve to the resulting mixture, followed by uniform mixing.

Spherical copper powders having an average particle size of 7.2 $\mu$m (SF-Cu, a trade name, mfd. by Nippon Atomized Metal Powders Corp.) were dipped in diluted hydrochloric acid. After washing with pure water, the copper powders were placed in a mixed solution of AgCN 80 g/water 1 kg and stirred at 25±5° C. for 20 minutes for electroless plating. After washing with water and drying, there were obtained silver-plated copper powders.

Then, 400 g of the resulting silver-plated copper powders and 8 kg of zirconia balls having a diameter of 5 mm were placed in a 2-liter ball mill and revolved at 60 r.p.m. for 30 minutes to give electroconductive composite metal powders by deforming the silver-plated copper powders.

The major axis of particles of the resulting electroconductive composite metal powders was in the range of 2 to 24 $\mu$m, and 11.5 $\mu$m in average. The ratio of major axis/thickness was in the range of 3 to 14, and 9 in average. The covered area with silver was in the range of 60 to 85% of the whole surface area, and 75% in average.

The resin composition obtained above in an amount of 145 g and 215 g of the electroconductive composite metal powders obtained above were mixed and dispersed uniformly using a mixing and griding machine and a three-roll mill to give an electroconductive paste. The content of the electroconductive composite metal powders was 60% based on the solid content of the electroconductive paste.

Using the electroconductive paste, a test pattern shown in FIG. 1 was printed on a paper base phenol resin copper-clad laminate having a thickness of 1.6 mm and through-holes of 0.8 mm in diameter (MCL-437F, a trade name, mfd. by Hitachi Chemical Co., Ltd.). The through-holes were also filled with the electroconductive paste and heated at 60° C. for 30 minutes and at 160° C. for 30 minutes in the air to give circuit conductors. In FIG. 1, numeral 1 is a through-hole, numeral 2 denotes the paper base phenol resin copper-clad laminate, and numeral 3 denotes a circuit conductor.

Resistance of the resulting circuit conductors was measured. The resistance of through-holes except for the resistance of copper foil was 22 m$\Omega$/hole in average of 54 holes. The resistivity measured after printing on the plane was 95 $\mu\Omega\cdot$cm. Insulating resistance between neighboring through-holes was $10^8$ $\Omega$ or more.

After subjected to a thermal shock test, the resistance of through-hole was 26.2 m$\Omega$/hole in average. Further, after a wet loading test, the insulating resistance between through-holes was $10^8$ $\Omega$ or more.

The thermal shock test was carried out by heating at 125° C. for 30 minutes and cooling at −65° C. for 30 minutes as one cycle, and repeating 100 cycles.

The wet loading test was carried out by applying a voltage of 50 V to neighboring lines and maintaining for 2000 hours at 40° C. and 90% RH.

After subjecting to solder resistance test (at 260° C., 10 seconds, 5 times), the changing rate of electric resistance was within 30%.

Example 10

The silver-plated copper powders obtained in Example 9 in an amount of 250 g and 5 kg of zirconia balls having a diameter of 5 mm were placed in a cylinder having a volume of 2 liters and vibrated for 10 minutes using a vibration mill. As a result, the silver-plated copper powders were deformed to give an electroconductive composite metal powders.

The major axis of particles of the electroconductive composite metal powders was in the range of 3 to 25 $\mu$m, and 11.5 $\mu$m in average. The ratio of major axis/thickness was in the range of 2 to 12, and 7 in average. The covered area with silver was in the range of 60 to 85% of the whole surface area, and 70% average.

An electroconductive paste was obtained by adding 145 g of the resin composition obtained in Example 9 to 240 g of the electroconductive composite metal powders obtained above and subjecting to the same treatment as in Example 9. The content of the electroconductive composite metal powders was 63% based on the solid content of the electroconductive paste.

Circuit conductors were prepared and evaluated in the same manner as described in Example 9.

As a result, the resistance of through-holes as 21.5 m$\Omega$/hole in average of 54 holes. The resistivity measured after printing on the plane was 102 $\mu\Omega\cdot$cm. The insulating resistance between neighboring through-holes was $10^8$ $\Omega$ or more.

The resistance of through-holes after the thermal shock test was 24.5 m$\Omega$/hole in average. The insulating resistance between neighboring through-holes after the wet loading test was $10^8$ $\Omega$ or more. The changing rate of electric resistance after the solder resistance test in the same manner as in Example 9 was within 30%.

Comparative Example 7

An electroconductive paste was prepared by adding 145 g of the resin composition obtained in Example 9 to 195 g of silver-plated copper powder obtained in Example 9 (but not flattened) and subjecting to the same treatment as described in Example 9. The covered area with silver was in the range of 93 to 99% of the whole surface area, and 97% in average. The content of the electroconductive composite metal powders was 57% based on the solid content of the electroconductive paste.

Circuit conductors were produced and evaluated in the same manner as described in Example 9.

The resistance of through-holes was 228 m$\Omega$/hole in average of 54 holes. The resistivity measured after printing on the plane was 350 $\mu\Omega\cdot$cm. The insulating resistance between neighboring through-holes was $10^8$ $\Omega$ or more. The through-hole resistance after the thermal shock test was 251 m$\Omega$/hole in average. The insulating resistance between through-holes after the wet loading test was $10^8$ $\Omega$ or more. The changing rate of electric resistance after the solder resistance test in the same manner as described in Example 9 was 200%.

Example 11

An electroconductive paste was obtained by adding 195 g of the electroconductive composite metal powders obtained in Example 9 to 145 g of the resin composition obtained in Example 9 and subjecting to uniform mixing and dispersing using a mixing and grinding machine and a three-roll mill. The content of the electroconductive composite metal powders was 66.1% based on the solid content of the electroconductive paste.

Figure 2:
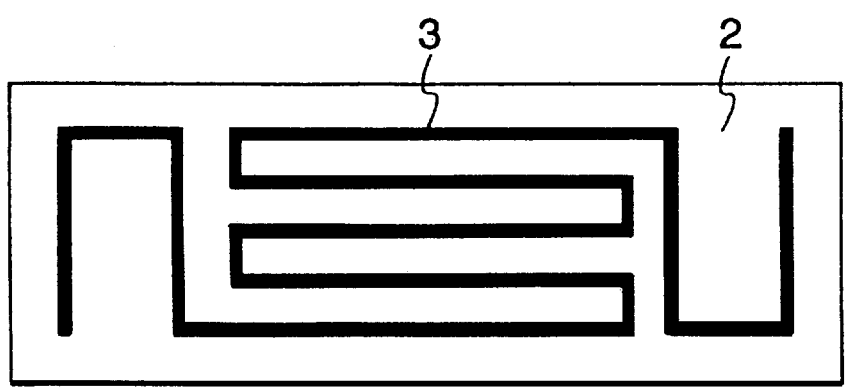
FIG. 2 is a plan view of an electromagnetic wave shielding material wherein an electroconductive paste is printed on a paper base phenolic resin copper-clad laminate.

Using the resulting electroconductive paste, a test pattern shown in FIG. 2 was printed on a paper base phenol resin copper-clad laminate having a thickness of 1.6 mm (MCL-437F, a trade name, mfd. by Hitachi Chemical Co., Ltd.). After heating in the air at 60° C. for 30 minutes and at 160° C. for 30 minutes, there was obtained an electromagnetic wave shielding material formed thereon circuit conductors 3.

The electric resistance of the resulting electromagnetic shielding material was measured. As a result, the resistivity was 25 $\mu\Omega$·cm, and the sheet resistance was 13 m$\Omega$/square. After the thermal shock test (125° C. for 30 minutes and −65° C. for 30 minutes in one cycle, 100 cycles) and the solder resistance test (260° C., 10 seconds, 5 times), the changing rate of electric resistance was within 10%, respectively. The changing rate of electric resistance when held at 60° C. in 95% RH for 1000 hours was within 10%.

Example 12

An electroconductive paste was prepared by mixing uniformly 100 parts of the electroconductive composite metal powders obtained in Example 1, 10 parts of bisphenol A liquid epoxy resin (Epikote 828, a trade name, mfd. by Yuka Shell Co., Ltd.), 0.3 part of imidazole as a curing agent, and 5 parts of butyl Cellosolve as a solvent. Properties were evaluated in the same manner as described in Example 1.

As a result, the resistivity of cured electroconductive paste was 90 $\mu\Omega$·cm in average, and the time required for passing 200 $\mu$A of leakage current was 80 minutes in average.

On the other hand, using the electroconductive paste, a test pattern having a size of 4 mm×4 mm and 160 $\mu$m thick was printed on a paper base phenol resin copper-clad laminate having a thickness of 1.6 mm (MCL-437F, a trade name, mfd. by Hitachi Chemical Co., Ltd.), from which a copper foil was removed. Then, a chip condenser (an electronic part) having a size of 5 mm×5 mm was mounted on the test pattern and subjected to treatment.

The resistivity of cured electroconductive paste after adhesion under pressure was 30 $\mu\Omega$·cm in average. The adhesive strength of the chip condenser was 1.5 kg/chip, which value was a sufficient adhesive strength for electronic parts.

Example 13

Electroconductive composite metal powders wherein the amount of silver for covering was 20% were obtained in the same manner as described in Example 1 except for using 80 parts (160 g) of fine spherical copper powders having an average particle size of 2.0 $\mu$m (mfd. by Nippon Atomized Metal Powders Corp.) and 20 parts (40 g) of very fine spherical silver powders used in Example 8, and using zirconia balls having a diameter of 5 $\mu$m.

The major axis of particles of the resulting electroconductive composite metal powders was in the range of 5 to 20 $\mu$m, and 10 $\mu$m in average. The ratio of major axis/thickness was in the range of 2 to 20, and 5 in average. The covered area with silver was in the range of 40 to 60% of the whole surface area, and 52% in average. The thickness of the silver covering layer was in the range of 0.005 to 0.07 $\mu$m, and 0.03 $\mu$m in average. The thickness of the layer of a mixture of noble metal (silver 80 to 20 atomic %) and non-noble metal (copper) was in the range of 0.01 to 0.05 $\mu$m, and 0.015 $\mu$m in average, and in the range of 1/7 to 2/3, and 1/2 in average of the thickness of the silver covering layer.

An electroconductive paste was prepared and evaluated in the same manner as described in Example 1.

The resistivity of cured electroconductive paste was 130 $\mu\Omega$·cm in average, and the time required for passing 200 $\mu$A of leakage current was 30 minutes in average.

Example 14

An electroconductive paste was prepared by adding 12 parts of novolac phenol resin (PS-2607, a trade name, mfd. by Gunei Chemical Industry Co., Ltd.), 2 parts of bisphenol A epoxy resin (Epikote 828, a trade name, mfd. by Yuka Shell Epoxy Co., Ltd.) and 15 parts of butyl Cellosolve as a solvent to 100 parts of mixed powders obtained by uniformly mixing 50% of electroconductive composite metal powders obtained in Example 8 and 50% of silver powders used in Comparative Example 3 in a V-type mixer, followed by uniform mixing. Properties were evaluated in the same manner as described in Example 8.

The resistivity of cured electroconductive paste was 70 $\mu\Omega$·cm in average, and the time required for passing 200 $\mu$A of leakage current was 15 minutes in average.

Example 15

Electroconductive composite metal powders wherein the amount of silver for covering was 30% were obtained in the same manner as described in Example 1 except for using 50 parts (100 g) of spherical copper powders having an average particle size of 6 $\mu$m (SF-Cu, a trade name, mfd. by Nippon Atomized Metal Powders Corp.) and 50 parts (100 g) of very fine spherical silver powder used in Example 8.

The major axis of particles of the resulting electroconductive composite metal powders was in the range of 2 to 30 $\mu$m, and 15 $\mu$m in average. The ratio of major axis/thickness was in the range of 2 to 15, and 6 in average. The covered area with silver was in the range of 45 to 75%, and 65% in average. The thickness of the silver covering layer was in the range of 0.01 to 0.2 $\mu$m, and 0.05 $\mu$m in average. The thickness of the layer of a mixture of noble metal (silver 80 to 20 atomic %) and non-noble metal (copper) was in the range of 0.01 to 0.06 $\mu$m, and 0.02 $\mu$m in average, and in the range of 1/5 to 1/2, and 1/3 in average of the thickness of the silver covering layer.

An electroconductive paste was prepared and evaluated in the same manner as described in Example 1.

The resistivity of cured electroconductive paste was 60 $\mu\Omega$·g-cm in average, and the time required for passing 200 $\mu$A of leakage current was 10 minutes in average.

As mentioned above, the electroconductive paste of the present invention shows high electroconductivity and excellent prevention of migration.

Further, electric circuit devices obtained by using the electroconductive paste is excellent in adhesiveness to electronic parts and can be used as a substitute for a lead-free solder.

What is claimed is:
1. An electroconductive composite metal powder comprising non-noble metal powder particles of a non-noble metal, which have a flat shape, the particles each having a surface area and a weight, 50% or more of the surface area of said particles being covered with a noble metal in an amount of 2 to 30% by weight based on the weight of the non-noble metal powder particles, thereby providing a noble metal covering layer, and with a layer of a mixture of the non-noble metal and the noble metal being interposed between the non-noble metal powder particles and the noble metal covering layer wherein the layer of a mixture of the non-noble metal has a thickness of ½ to 1/50 of a thickness of the noble metal covering.

2. An electroconductive composite metal powder according to claim 1, wherein the layer of a mixture of the non-noble metal and noble metal contains the noble metal in an amount of 80 to 20 atomic % and the non-noble metal in an amount of 20 to 80 atomic %.

3. An electroconductive composite metal powder according to claim 1, wherein the noble metal covering layer has a thickness of 0.01 to 0.2 μm.

4. An electroconductive composite metal powder according to claim 1, wherein each non-noble metal powder particle has a major axis and a thickness, and wherein said particles have a ratio of major axis/thickness of 2 to 30.

5. An electroconductive paste comprising
   electroconductive composite metal powder, comprising non-noble metal powder particles of a non-noble metal, which have a flat shape, the particles each having a surface area and a weight, 50% or more of the surface area of said particles being covered with a noble metal in an amount of 2 to 30% by weight based on the weight of the non-noble metal powder particles, thereby providing a noble metal covering layer, and with a layer of a mixture of the non-noble metal and noble metal being interposed between the non-noble metal powder particles and the noble metal covering layer, wherein the layer of a mixture of the non-noble metal and noble metal has a thickness of ½ to 1/50 of a thickness of the noble metal covering layer and
   a binder.

6. An electroconductive paste according to claim 5, wherein the layer of a mixture of the non-noble metal and noble metal contains the noble metal in an amount of 80 to 20 atomic % and the non-noble metal in an amount of 20 to 80 atomic %.

7. An electroconductive paste according to claim 5, wherein the noble metal covering layer has a thickness of 0.01 to 0.2 μm.

8. An electroconductive paste according to claim 5, wherein each non-noble metal powder particle has a major axis and a thickness, and wherein said particles have a ratio of major axis/thickness of 2 to 30.

9. An electroconductive composite metal powder according to claim 1, wherein the non-noble metal is selected from the group consisting of copper, nickel, zinc, tin, chromium, and alloys of at least one of copper, nickel, zinc, tin and chromium.

10. An electroconductive composite metal powder according to claim 9, wherein the noble metal is selected from the group consisting of gold, silver, palladium and platinum.

11. An electroconductive composite metal powder according to claim 1, wherein the noble metal is selected from the group consisting of gold, silver, palladium and platinum.

12. An electroconductive composite metal powder according to claim 4, wherein the major axis of the non-noble metal powder particles is at most 100 μm.

13. An electroconductive composite metal powder according to claim 1, wherein said flat shape is a flake shape.

14. An electroconductive composite metal powder according to claim 13, wherein the non-noble metal is selected from the group consisting of copper, nickel, zinc, tin, chromium, and alloys of at least one of copper, nickel, zinc, tin and chromium.

15. An electroconductive composite metal powder according to claim 14, wherein the noble metal is selected from the group consisting of gold, silver, palladium and platinum.

16. An electroconductive paste according to claim 5, wherein said binder is selected from the group consisting of epoxy resin, phenol resin, polyester resin, polyamide resin, polyimide resin, polyamide-polyimide resin, acrylic resin and glass frit.

17. An electroconductive paste according to claim 5, wherein said binder is included in an amount of 5%–30% by weight, of the total weight of the paste.

18. An electroconductive paste according to claim 5, wherein the non-noble metal is selected from the group consisting of copper, nickel, zinc, tin, chromium, and alloys of at least one of copper, nickel, zinc, tin and chromium.

19. An-electroconductive paste according to claim 18, wherein the noble metal is selected from the group consisting of gold, silver, palladium and platinum.

20. An electroconductive paste according to claim 5, wherein the noble metal is selected from the group consisting of gold, silver, palladium and platinum.

21. An electroconductive paste according to claim 5, wherein said flat shape is a flake shape.

22. An electroconductive paste according to claim 21, wherein the non-noble metal is selected from the group consisting of copper, nickel, zinc, tin, chromium, and alloys of at least one of copper, nickel, zinc, tin and chromium.

23. An electroconductive paste according to claim 22, wherein the noble metal is selected from the group consisting of gold, silver, palladium and platinum.

24. An electroconductive composite metal powder according to claim 1, wherein said layer of a mixture of the non-noble metal and the noble metal is a layer formed by applying mechanical energy to particulate of the non-noble metal having the noble metal thereon or while forming the noble metal thereon, so as to form the non-noble metal powder particles having said layer of a mixture of the non-noble metal and the noble metal.

25. An electroconductive composite metal powder according to claim 24, wherein the mechanical energy is applied to the particulate of the non-noble metal while forming the noble metal thereon.

26. An electroconductive composite metal powder according to claim 24, wherein the mechanical energy is applied to the particulate of the non-noble metal having the noble metal thereon.

27. An electroconductive composite metal powder according to claim 24, wherein the mechanical energy is applied to a mixture of the particulate of the non-noble metal and particulate noble metal.

28. An electroconductive paste according to claim 5, wherein said layer of a mixture of the non-noble metal and the noble metal is a layer formed by applying mechanical energy to particulate of the non-noble metal having the noble metal thereon or while forming the noble metal thereon, so as to form the non-noble metal powder particles having said layer of a mixture of the non-noble metal and the noble metal.

29. An electroconductive paste according to claim 28, wherein the mechanical energy is applied to the particulate of the non-noble metal while forming the noble metal thereon.

30. An electroconductive paste according to claim 28, wherein the mechanical energy is applied to the particulate of the non-noble metal having the noble metal thereon.

31. An electroconductive paste according to claim 28, wherein the mechanical energy is applied to a mixture of the particulate of the non-noble metal and particulate noble metal.

32. An electroconductive composite metal powder comprising non-noble metal powder particles of a non-noble metal, which have a flat shape, the particles each having a surface area and a weight, 50% or more of the surface area of said particles being covered with a noble metal in an amount of 2 to 30% by weight based on the weight of the non-noble metal powder particles, thereby providing a noble metal covering layer, and a layer of a mixture of the non-noble metal and noble metal interposed between the non-noble metal having a thickness of ½ to 1/50 of a thickness of the noble metal covering layer powder particles and the noble metal covering layer, the electroconductive composite metal powder being powder formed by applying mechanical energy to particulate of the non-noble metal having the noble metal thereon or while forming the noble metal thereon.

33. An electroconductive composite metal powder according to claim 32, wherein the mechanical energy is applied to the particulate of the non-noble metal having the noble metal thereon.

34. An electroconductive composite metal powder according to claim 32, wherein the mechanical energy is applied to a mixture of the particulate of the non-noble metal and particulate noble metal.

35. An electroconductive paste comprising a binder and the electroconductive composite metal powder according to claim 32.

36. An electroconductive paste according to claim 35, wherein the mechanical energy is applied to the particulate of the non-noble metal having the noble metal thereon.

37. An electroconductive paste according to claim 35, wherein the mechanical energy is applied to a mixture of the particulate of the non-noble metal and particulate noble metal.

* * * * *